United States Patent
Tzeng

(10) Patent No.: US 7,055,141 B2
(45) Date of Patent: May 30, 2006

(54) HUMANITY INTERFACE DEVELOPMENT SYSTEM OF TESTING PROGRAM OF CIRCUIT BOARD

(75) Inventor: Hwai-Der Tzeng, Taichang (TW)

(73) Assignee: Aerospace Industrial Development Co., Ltd., Taichang (TW)

(*) Notice: Subject to any disclaimer, the term of this patent is extended or adjusted under 35 U.S.C. 154(b) by 650 days.

(21) Appl. No.: 09/935,647

(22) Filed: Aug. 24, 2001

(65) Prior Publication Data

US 2002/0049929 A1   Apr. 25, 2002

(30) Foreign Application Priority Data

Aug. 25, 2000  (TW) .................................. 89117450 A

(51) Int. Cl.
*G06F 9/44* (2006.01)

(52) U.S. Cl. ...................... 717/132; 717/142; 717/143; 717/144; 714/38

(58) Field of Classification Search ........ 717/101–144; 714/37–39
See application file for complete search history.

(56) References Cited

U.S. PATENT DOCUMENTS

| 5,335,342 | A | * | 8/1994 | Pope et al. ..................... 714/38 |
| 5,623,418 | A | * | 4/1997 | Rostoker et al. ............... 716/1 |
| 5,737,518 | A | * | 4/1998 | Grover et al. ................. 714/38 |
| 5,861,882 | A | * | 1/1999 | Sprenger et al. ............ 715/700 |
| 5,892,949 | A | * | 4/1999 | Noble ......................... 717/125 |
| 5,910,895 | A | * | 6/1999 | Proskauer et al. .......... 700/121 |
| 6,223,306 | B1 | * | 4/2001 | Silva et al. ................... 714/37 |
| 6,430,556 | B1 | * | 8/2002 | Goldberg et al. .............. 707/4 |
| 6,725,399 | B1 | * | 4/2004 | Bowman ...................... 714/38 |

* cited by examiner

Primary Examiner—Tuan Dam
Assistant Examiner—Chuck Kendall
(74) Attorney, Agent, or Firm—Rosenberg, Klein & Lee

(57) ABSTRACT

The present invention relates to a humanity interface development system of a testing program of a circuit board, essentially including: building configuration of objects to be tested, defining footing of objects to be tested, using a program generator, building data of the testing chapters, building documents and figure files of objects to be tested, building reference data, building intercepted data of coordinates of positions of the parts, building relationships of items to failure rates of parts, and linking and compiling files, thereby forming a humanity interface, to build a data base required by the testing programs simultaneously, for testing the same circuit board in a large amount manner, thereby achieving the purpose of convenience and utility.

17 Claims, 12 Drawing Sheets

HUMANITY INTERFACE DEVELOPMENT SYSTEM OF TESTING PROGRAM OF CIRCUIT BOARD

BACKGROUND OF THE INVENTION

1. Field of the Invention

The present invention relates to a humanity interface development system of a testing program of a circuit board, and more particularly to a humanity interface development system of a testing program of a circuit board 2. Description of the Related Art A conventional testing program for testing the circuit board needs a designer who is trained professionally to design the program. Thus, when circuit boards having different requirements need to be tested, persons having the professional technology or background are needed for amendment or maintenance of the program, thereby causing inconvenience to the opentor.

SUMMARY OF THE INVENTION

The primary objective of the present invention is to provide a humanity interface development system of a testing program of a circuit board, essentially including: building configuration of objects to be tested, defining footing of objects to be tested, using a program generator, building data of the testing chapters, building documents and figure files of objects to be tested, building reference data, building intercepted data of coordinates of positions of the parts, building relationships of items to failure rates of parts, and linking and compiling files, thereby forming a humanity interface, to build a data base required by the testing programs simultaneously, for testing the same circuit board in a large amount manner, thereby efficiently achieving the purpose of convenience and utility.

In accordance with the present invention, there is provided a humanity interface development system of a testing program of a circuit board, comprising: a main menu by which an operator may select one of multiple items with data pre-built therein, the main menu including the following items: building configuration of objects to be tested, defining footing of objects to be tested, using a program generator, building data of testing chapters, building documents and figure files of objects to be tested, building reference data, building intercepted data of coordinates of positions of parts, building the relationships of items to failure rates of parts, and linking and compiling files, building of data of each object to be tested co-operating with the program generator to produce the required program, and the items of building data of testing chapters and linking and compiling files co-operating with steps of building of data of each object to be tested, so that the operator may use data base and programs that are built according to existing orders of the system for testing a circuit board.

Further benefits and advantages of the present invention will become apparent after a careful reading of the detailed description with appropriate reference to the accompanying drawings.

DETAILED DESCRIPTION OF THE INVENTION

Figure 1:
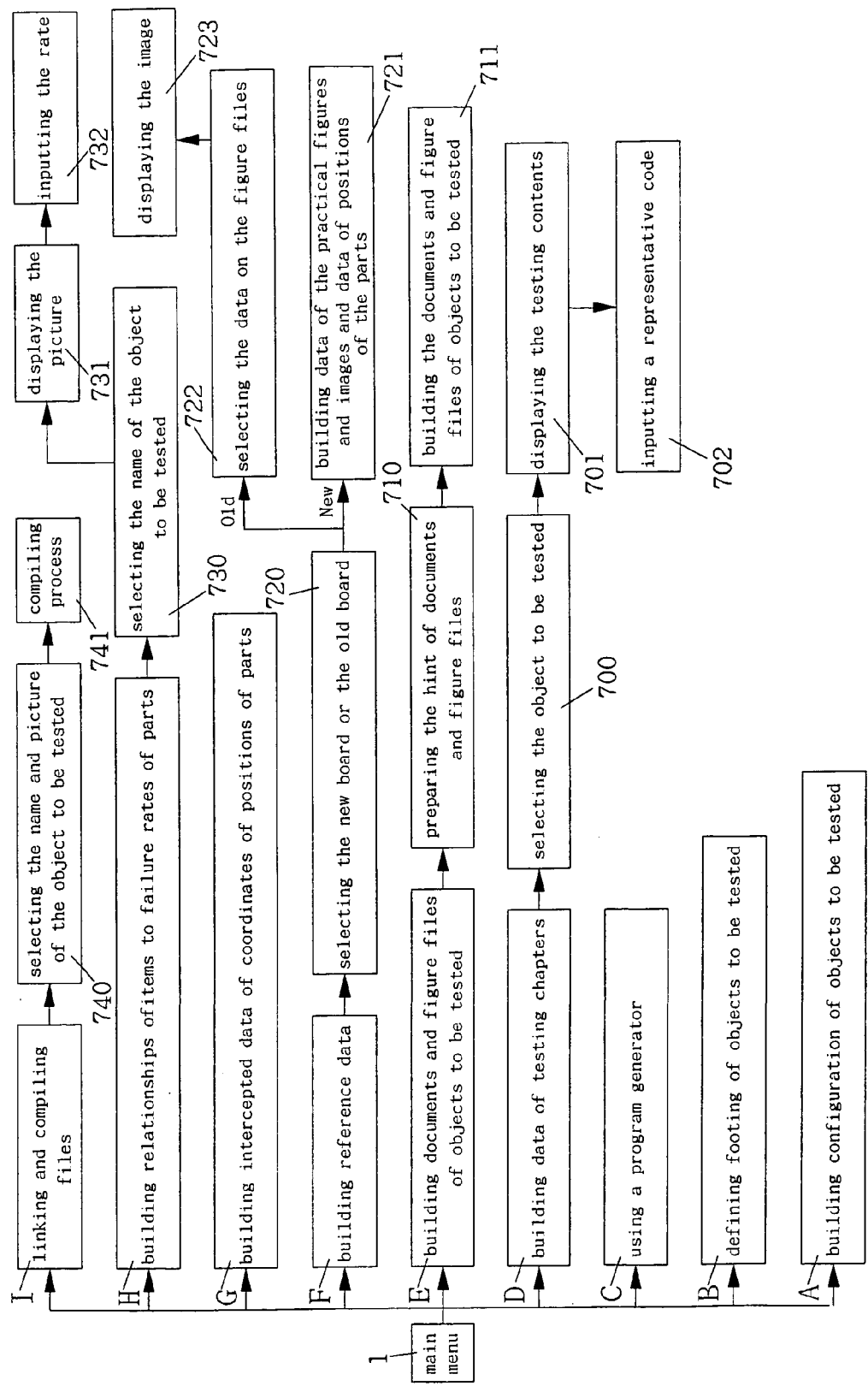
FIG. 1 is a flow chart of a humanity interface development system of a testing program of a circuit board in accordance with the present invention.

Referring to the drawings and initially to FIG. 1, a humanity interface development system of a testing program of a circuit board in accordance with a preferred embodiment of the present invention comprises a main menu 1 by which the operator may select one of multiple items with data pre-built therein.

The main menu 1 essentially contains nine primary items, including the following procedures: building configuration of objects (such as a circuit board) to be tested "A", defining footing of objects to be tested "B", using a program generator "C", building data of testing chapters "D", building documents and figure files of objects to be tested "E", building reference data "F", building intercepted data of coordinates of positions of parts "G", building relationships of items to failure rates of parts "H", and linking and compiling files "I".

The building of data of each object to be tested may co-operate with the program generator "C" to produce the required program, and the items of building data of testing chapters "D" and linking and compiling files "I" may co-operate with the steps of building of data of each object to be tested, so that the operator may conveniently use the data base and the programs that are built according to the existing orders of the system for testing the circuit board.

It is to be noted that, the steps of building of data of each object to be tested includes the following procedures: building configuration of objects to be tested "A", defining footing of objects to be tested "B", building documents and figure files of objects to be tested "E", building relationships of items to failure rates of parts "H", building reference data "F", and building intercepted data of coordinates of positions of parts "G".

Figure 2:
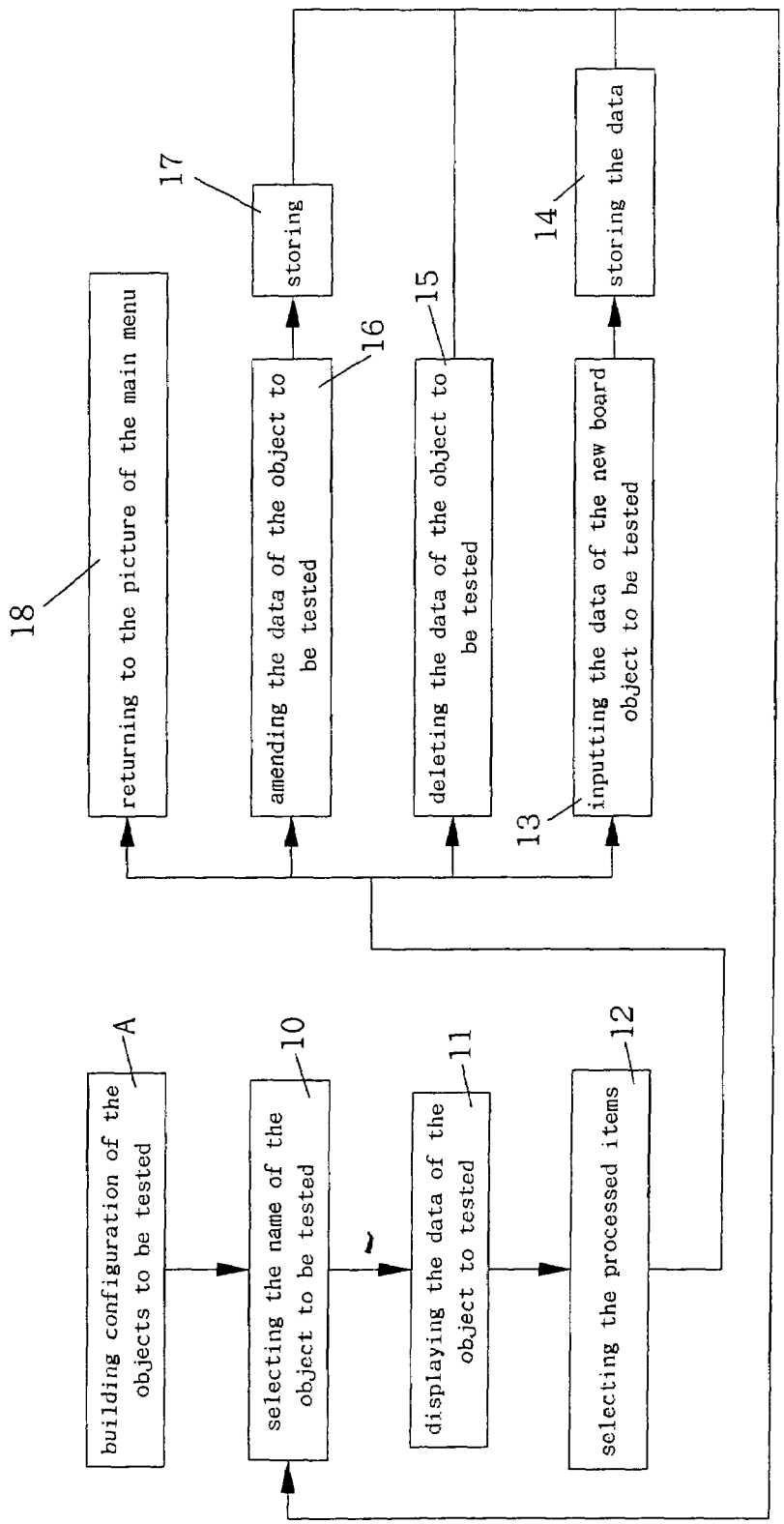
FIG. 2 is a flow chart of an item of building configuration of the objects to be tested of the humanity interface development system of a testing program of a circuit board in accordance with the present invention.

Referring to FIG. 2, the item of building configuration of the objects to be tested "A" includes the following steps:

Selecting the name of the object to be tested 10: displaying the name of the object to be selected from the existing data base of the display, choosing and identifying the name of the object;

Displaying the data of the object to be tested 11: displaying the original chosen records in the data base to facilitate judgement of the following addition and amendment; and Selecting the processed items 12: selecting the items of addition, deletion, amendment or returning to the previous page, wherein if the item of addition is chosen, the operator needs to input the data of the new board object to be tested 13, then store the data 14, and then return to the step of selecting the name of the object to be tested 10; if the item of deletion is chosen, the data of the object to be tested is deleted directly 15; if the item of amendment is chosen, the data of the object to be tested is amended 16, and is stored 17; if the item of returning to the previous page is chosen, the operator may return to the picture of the main menu 18.

Thus, the contents of each basic configuration of the objects to be tested may be built.

Figure 3:
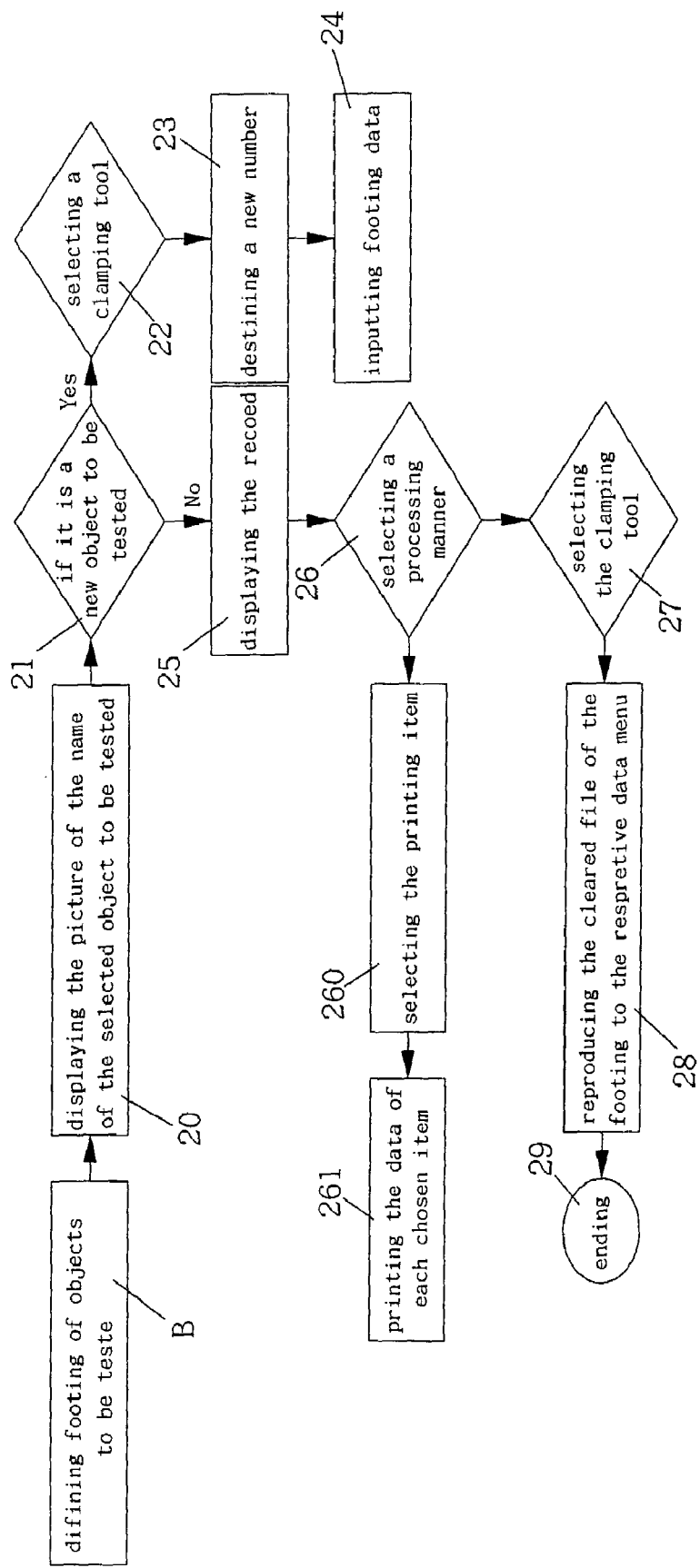
FIG. 3 is a flow chart of an item of defining footing of objects to be tested "B" of the humanity interface development system of a testing program of a circuit board in accordance with the present invention.

Referring to FIG. 3, the item of defining footing of objects to be tested "B" includes the following steps:

Displaying the picture of the name of the selected object to be tested 20: displaying the picture of the name and related illustration of the selected object to be tested, to facilitate direct reference of the operator;

If it is a new object to be tested 21: judging if it is a new object to be tested, if it is a new object to be tested, the operator may proceed the following settings, including:

Selecting a clamping tool 22: selecting an existing common clamping tool or making a new clamping tool;

Destining a new number 23: defining a new number to the new board to facilitate identification; and Inputting footing data 24: inputting data of each footing manually;

If it is not a new object to be tested, it means that the object to be tested is an electronic board that has generated the testing program, so that the data base of the system may directly display the record 25 for identification of the operator;

Selecting a processing manner 26: the operator may select printing, that is, the operator may select the printing item 260 to print the data of each chosen item 261 for reference; if the operator selects ending, he needs to select the clamping tool 27, that is, he has to select an existing common clamping tool or make a new clamping tool; if the operator selects the existing common clamping tool, the original footing data in the system may be processed directly, to reproduce the cleared file of the footing to the respective data menu 28, and the procedure is then ended 29; if the operator selects to make a new clamping tool, the procedure is directly ended 29.

Figure 4:
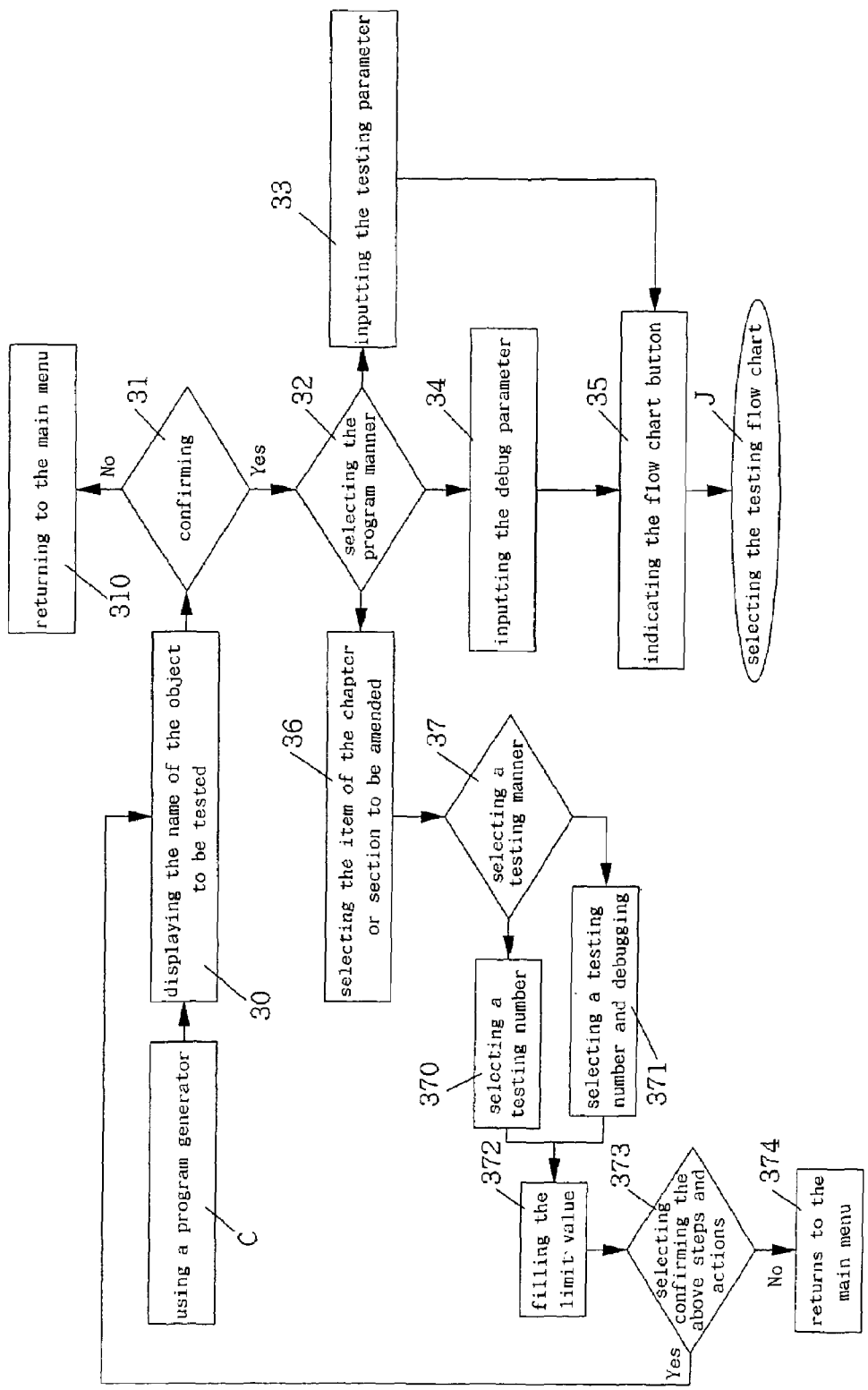
FIG. 4 is a flow chart of an item of using a program generator "C" of the humanity interface development system of a testing program of a circuit board in accordance with the present invention.
Figure 5:
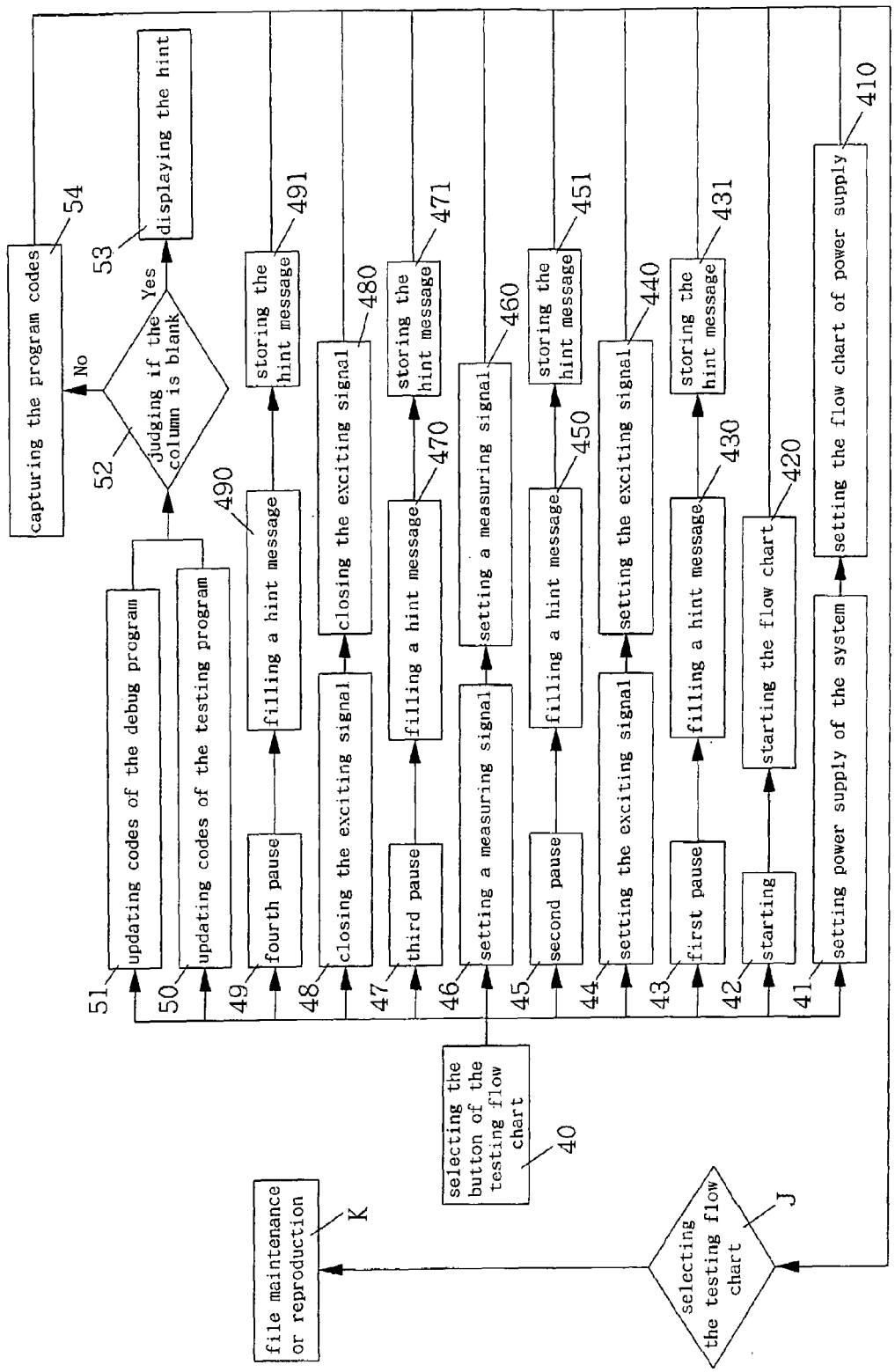
FIG. 5 is a flow chart of an item of selecting the testing flow chart of the humanity interface development system of a testing program of a circuit board in accordance with the present invention.

Referring to FIG. 4, the item of using the program generator "C" includes the following steps:

Displaying the name of the object to be tested 30: displaying the name the object to be tested and the related data for identification of the designer;

Confirming 31: if the operator confirms the object to be tested, the following procedure may be performed; if the operator does not confirm the object to be tested, the picture returns to the main menu 310;

Selecting the program manner 32: the operator may respectively select the modes of the program parameter, including testing, debug or limit; if the operator selects the testing mode, he may input the testing parameter 33, if the operator selects the debug mode, he may input the debug parameter 34, after the two items 33 and 34 are input, the system respectively enters the designs of test program or debug program, and the picture may indicate the flow chart button 35 to prepare to proceed the step of selecting the testing flow chart "J" as shown in FIG. 5; if the operator selects the limit mode, the picture indicates selecting the item of the chapter or section to be amended 36, and selecting a testing manner 37 to select a testing manner such as the function test or debug test, and after selection to perform the step of selecting a testing number 370 or selecting a testing number and debugging 371, then filling the limit value 372 for each program or step, then selecting confirming the above steps and actions 373, if the above steps and actions are not confirmed, the picture returns to the main menu 374, if the above steps and actions are confirmed, the data in the data base may be changed, and the picture returns to the step of displaying the name of the object to be tested 30;

Referring to FIG. 5, the item of selecting the testing flow chart "J" includes the following steps: file maintenance or reproduction "K", and selecting the button of the testing flow chart 40.

The item of selecting the item of the testing flow chart 40 may be changed and designed according to different testing processes and manners, and the following is the most complete process recently. The designer may change the following processes according to different requirements.

The process of selecting the item of the testing flow chart 40 includes the following steps: setting power supply of the system 41, starting 42, a first pause 43, setting the exciting signal 44, a second pause 45, setting a measuring signal 46, a third pause 47, closing the exciting signal 48, a fourth pause 49, updating codes of the testing program 50, and updating codes of the debug program 51.

Figure 6:
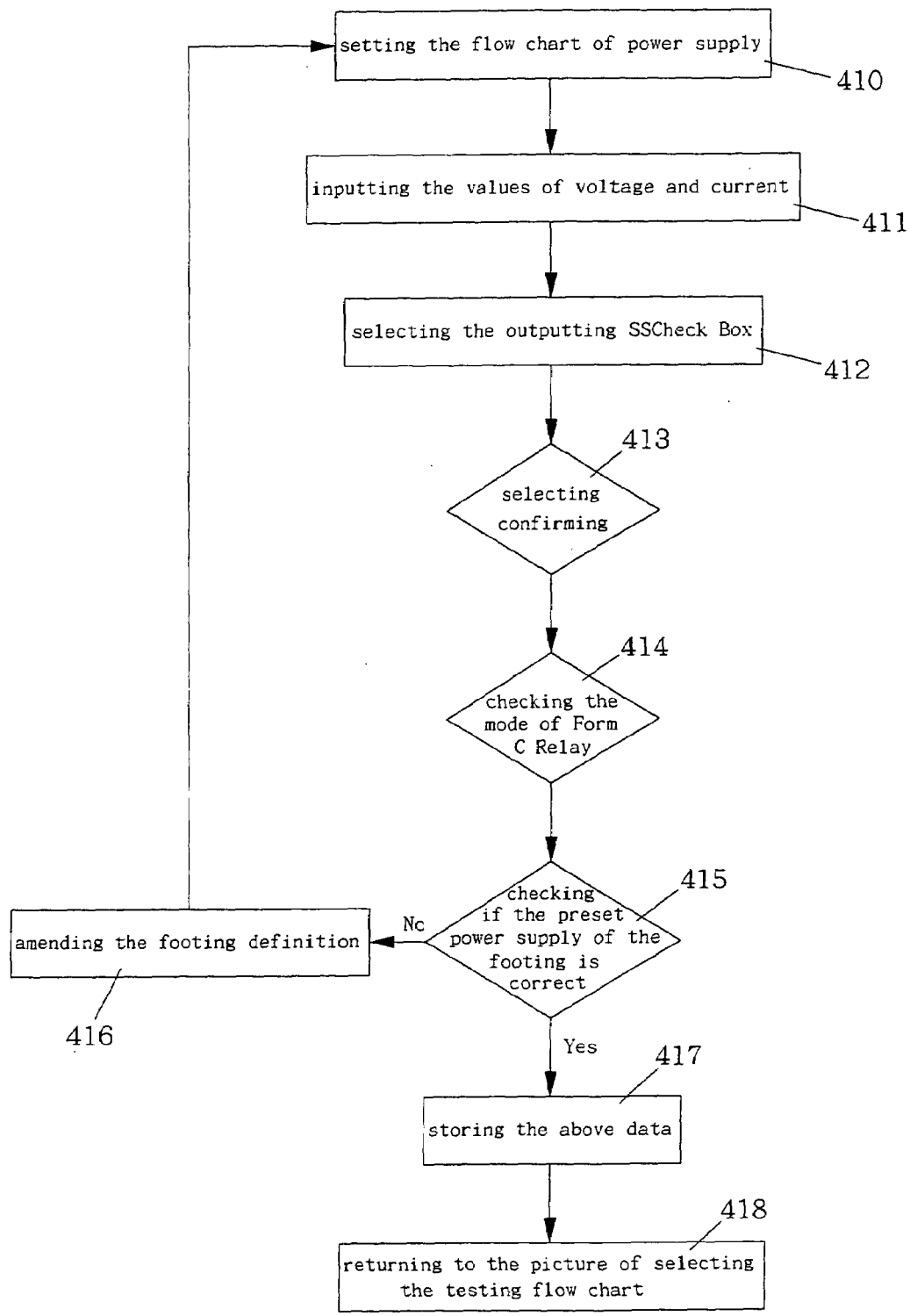
FIG. 6 is a flow chart of a procedure of setting power supply of the system of the humanity interface development system of a testing program of a circuit board in accordance with the present invention.

Referring to FIG. 6, the procedure of setting power supply of the system 41 includes the following steps:

Setting the flow chart of power supply 410: inputting the values of voltage and current 411, then selecting the picture of the next output mode, such as outputting SSCheck Box 412, then selecting confirming 413, if the above actions are confirmed, checking if the mode of the footing satisfies the standard mode of the footing, such as the mode of Form C Relay 414, then checking if the preset power supply of the footing is correct 415, if not, amending the footing definition 416 and returning to the step of setting the flow chart of power supply 410 to repeat the work; if the preset power supply of the footing is correct, storing the above data 417, and then returning to the picture of selecting the testing flow chart 418.

Figure 7:
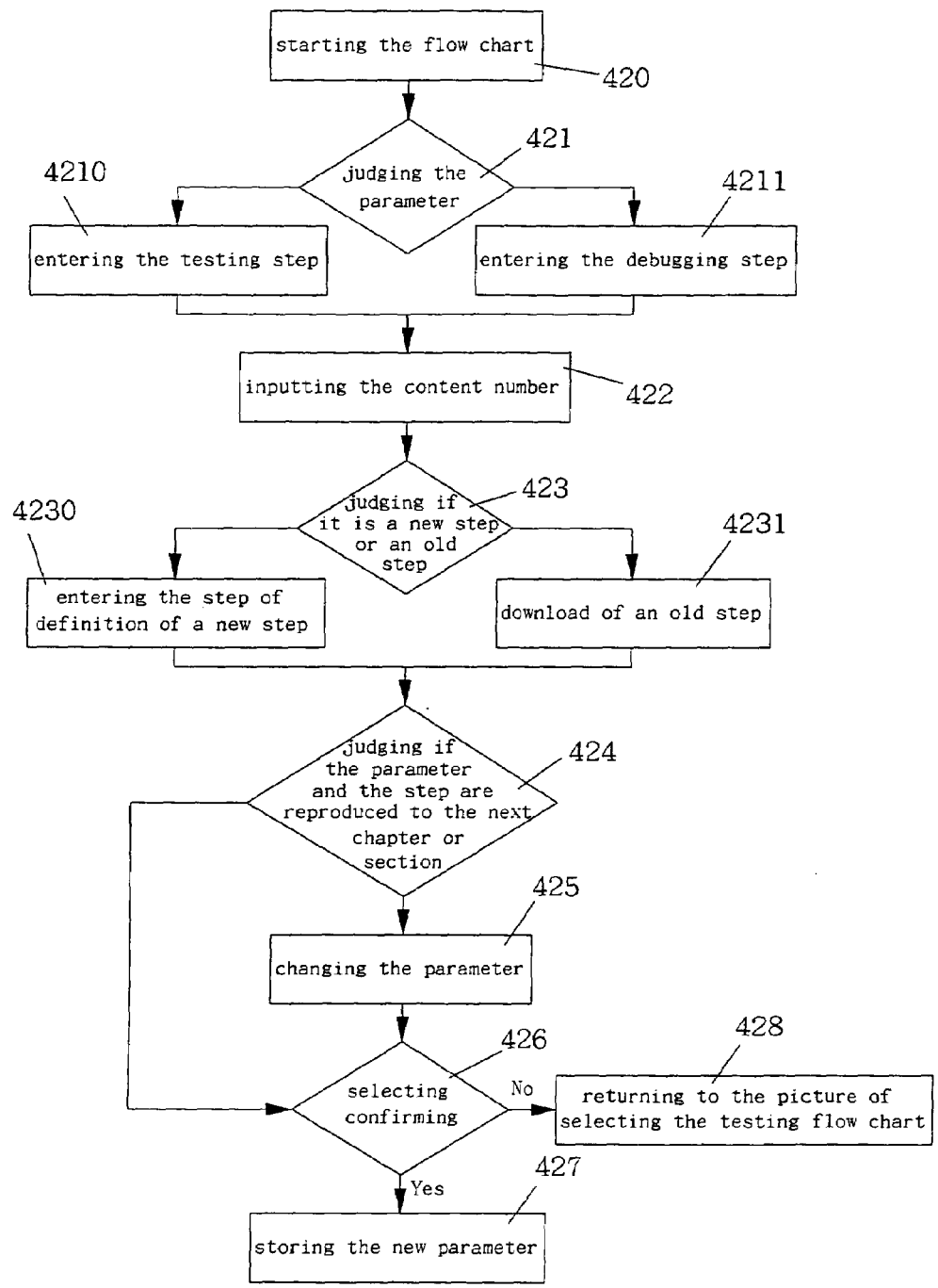
FIG. 7 is a flow chart of a starting procedure of the humanity interface development system of a testing program of a circuit board in accordance with the present invention.

Referring to FIG. 7, the starting procedure 42 includes the following steps:

Starting the flow chart 420: the system (such as the computer) directly judging the parameter 421 to directly enter the testing step 4210 or the debugging step 4211, then inputting the content number 422, then judging if it is a new step or an old step 423, to respectively enter the step of definition of a new step 4230 or download of an old step 4231, then judging if the parameter and the step are reproduced to the next chapter or section 424, if so, changing the parameter 425, then selecting confirming 426, if the above action is confirmed, storing the new parameter 427, if the above action is not confirmed, returning to the picture of selecting the testing flow chart 428.

Referring to FIG. 5, the processes of the first pause 43, the second pause 45, the third pause 47, and the fourth pause 49 respectively include the steps: filling a hint message 430, 450, 470 and 490, and storing the hint message 431, 451, 471 and 491.

Figure 8:
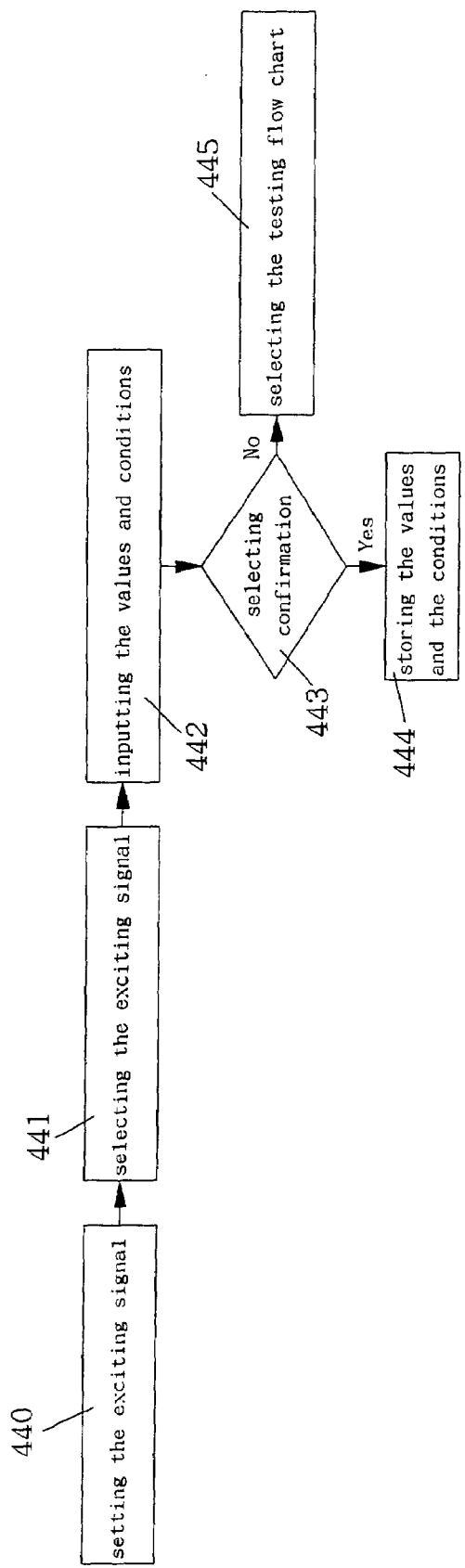
FIG. 8 is a flow chart of a procedure of setting the exciting signal of the humanity interface development system of a testing program of a circuit board in accordance with the present invention.

Referring to FIG. 8, the procedure of setting the exciting signal 44 includes the flow chart of setting the exciting signal 440 which includes the following steps: selecting the exciting signal 441, then inputting the values and conditions 442, then selecting confirmation 443, if the values and conditions are confirmed, storing the values and the conditions 444, if the values and the conditions are not confirmed, returning to the picture of selecting the testing flow chart 445.

Figure 9:
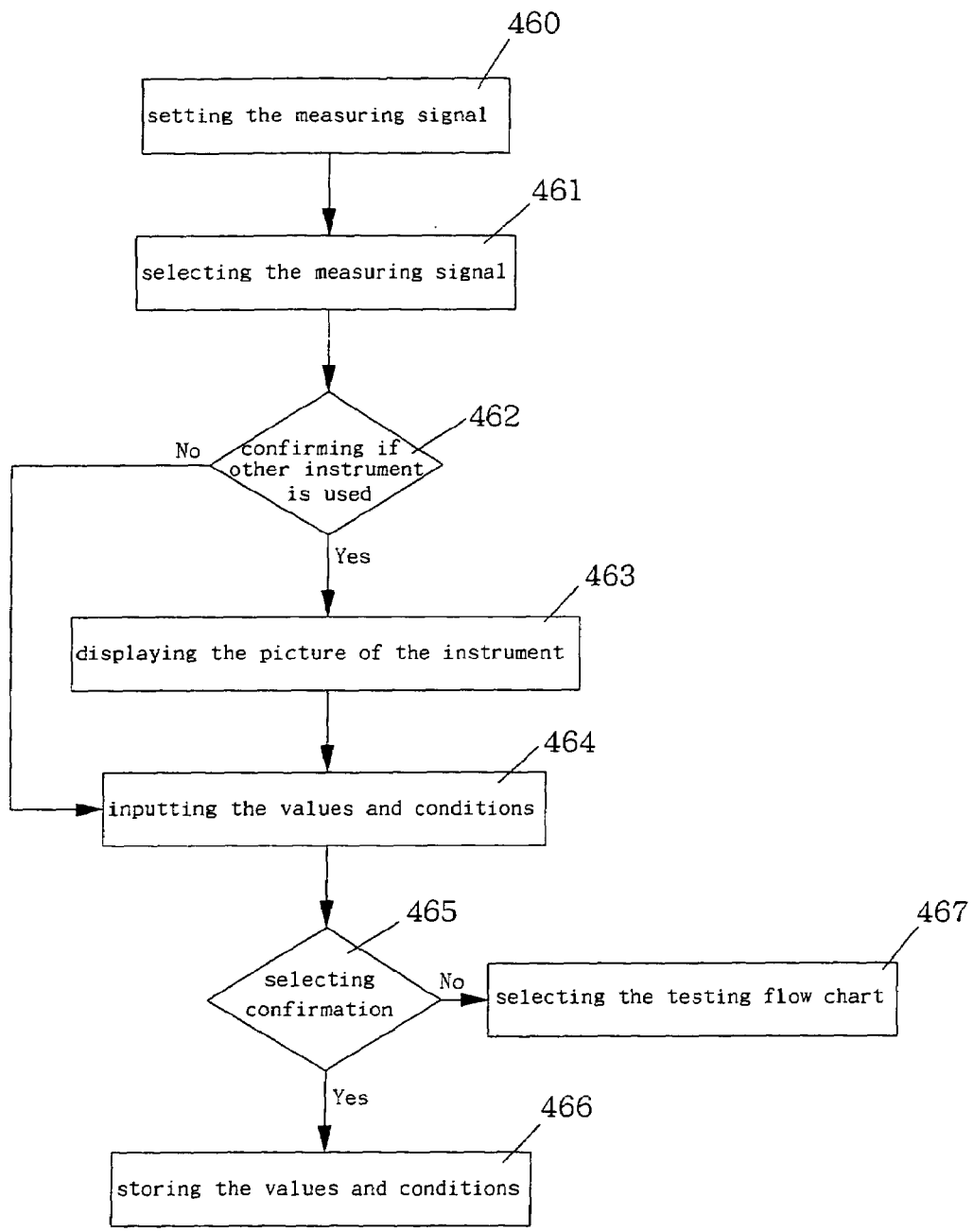
FIG. 9 is a flow chart of a procedure of setting a measuring signal of the humanity interface development system of a testing program of a circuit board in accordance with the present invention.

Referring to FIG. 9, the procedure of setting a measuring signal 46 includes the flow chart of setting the measuring signal 460 which includes the following steps: directly selecting the measuring signal 461, then confirming if other instrument (such as a wave indicator) is used 462, when confirming other instrument is used, displaying the picture of the instrument 463 and inputting the values and conditions 464, when confirming no other instrument is used, directly inputting the values and conditions 464, then selecting confirmation 465, if the values and conditions are confirmed, storing the values and conditions 466, if the values and conditions are not confirmed, returning to the picture of selecting the testing flow chart 467.

Figure 10:
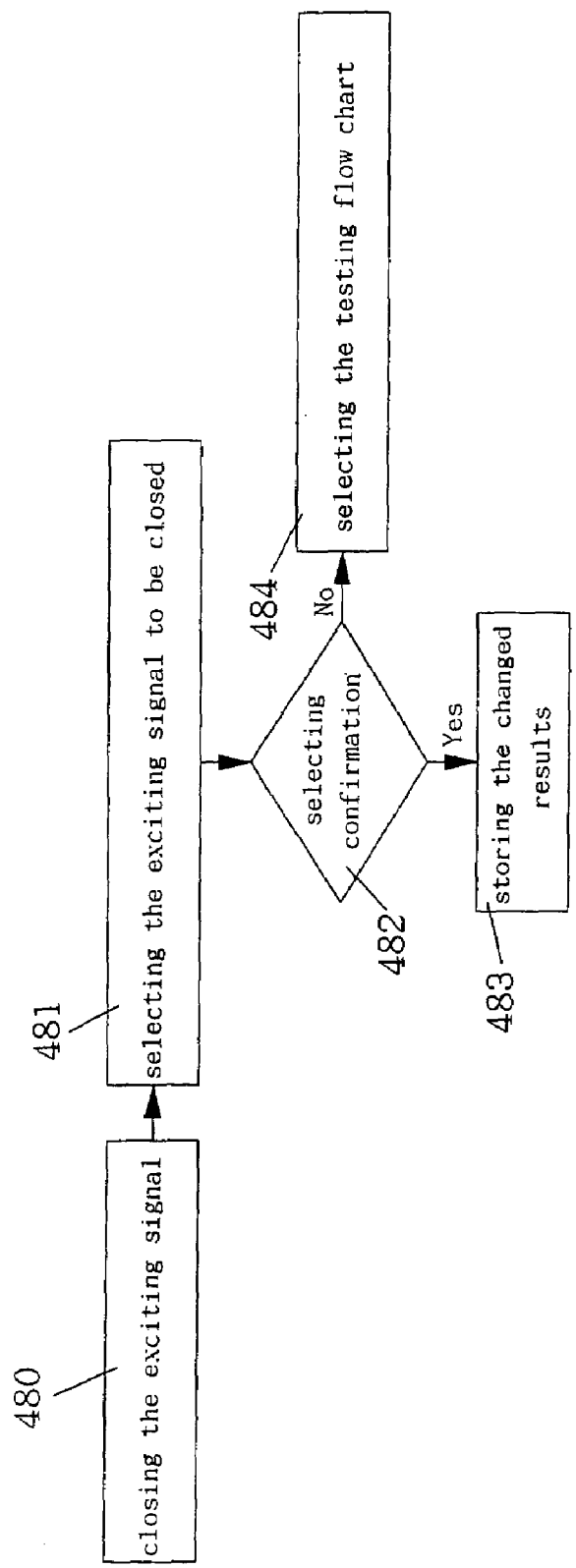
FIG. 10 is a flow chart of a procedure of closing the exciting signal of the humanity interface development system of a testing program of a circuit board in accordance with the present invention.

Referring to FIG. 10, the procedure of closing the exciting signal 48 includes the flow chart of closing the exciting signal 480 which includes the following steps: selecting the exciting signal to be closed 481, then selecting confirmation 482, if the selection is confirmed, storing the changed results 483, if the selection is not confirmed, returning to the picture of selecting the testing flow chart 484.

Referring again to FIG. 5, the procedures of updating codes of the testing program 50, and updating codes of the debug program 51 include the following steps: judging if the column is blank 52, if the column is blank, directly displaying the hint 53, if the column is not blank, performing the action of capturing the program codes 54.

Figure 11:
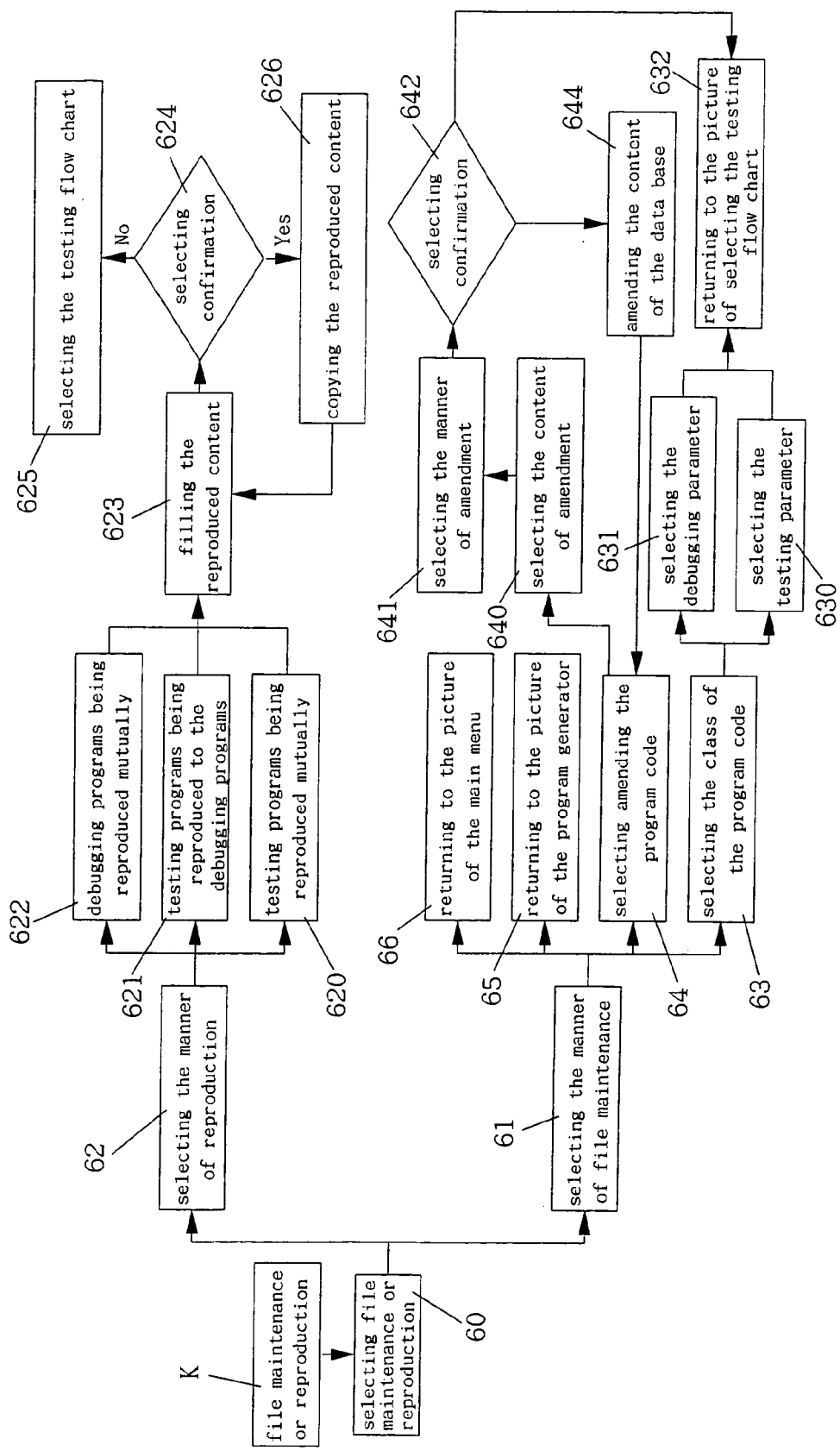
FIG. 11 is a flow chart of the process of file maintenance or reproduction of the humanity interface development system of a testing program of a circuit board in accordance with the present invention.

Referring to FIG. 11, the process of file maintenance or reproduction "K" includes the following steps:

Selecting file maintenance or reproduction 60: selecting the process of file maintenance or reproduction, if the process of file maintenance is selected, it is necessary to select the manner of file maintenance 61, if the process of reproduction is selected, it is necessary to select the manner of reproduction 62; wherein, If the operator selects the manner of file maintenance 61, it includes the following steps:

selecting the class of the program code 63: selecting the testing parameter 630 or the debugging parameter 631, then returning to the picture of selecting the testing flow chart 632, to respectively perform the design of the testing program or the debugging program;

selecting amending the program code 64: selecting the content of amendment 640 for testing or debugging, so as to select the number of the primary and secondary testing or debugging step, i.e., to make sure the content of the program, and selecting the manner of amendment 641 for different program code, so as to select the working process such as deletion, insertion or cancel, then selecting confirmation 642, if selecting the cancel process, then directly returning to the picture of selecting the testing flow chart 632, if selecting the working process of deletion or insertion, then amending the content of the data base 644, and then returning to the procedure of selecting amending the program code 64;

selecting returning to the picture of the program generator 65 or returning to the picture of the main menu 66, then returning to the destined position, to facilitate the following operator;

If the operator selects the manner of reproduction 62, it includes the steps of selecting three modes of reproduction, including: the testing programs being reproduced mutually 620, the testing programs being reproduced to the debugging programs 621, and the debugging programs being reproduced mutually 622; after selection, filling the reproduced content 623, then selecting confirmation 624, if not confirmed, then returning to the picture of selecting the testing flow chart 625, if confirmed, then copying the reproduced content 626 and returning to the picture of filling the reproduced content 623 to repeat the above-mentioned work until the work is finished.

Referring to FIG. 1, the item of building data of testing chapters "D" includes the following steps: selecting the object to be tested 700; then displaying the testing contents 701 to indicate the number and name of the testing contents of each chapter or section, and then inputting a representative code 702 into the content of the picture to facilitate classification.

Referring to FIG. 1, the item of building documents and figure files of objects to be tested "E" includes the following steps: preparing the hint of documents and figure files 710, so that when the designer selects the item of building documents and figure files of objects to be tested "E", the picture may display the related hints immediately, to remind the designer of preparing the related documents and figure files for requirement of inputting, and then the designer may make sure building the documents and figure files of objects to be tested 711.

Referring to FIG. 1, the item of building reference data "F" includes the following steps: selecting the new board or the old board 720, if selecting the new board, then building data of the practical figures and images and data of the positions of the parts 721 according to the instruction, so as to input the figure file data of the files of the practical figures and images and the files of the positions of the parts, and placing them in the destined menu, if selecting the old board, then directly selecting the data on the figure files 722 by the cursor, and then displaying the image 723 to display the picture of the related figure files for confirmation of the designer.

Figure 12:
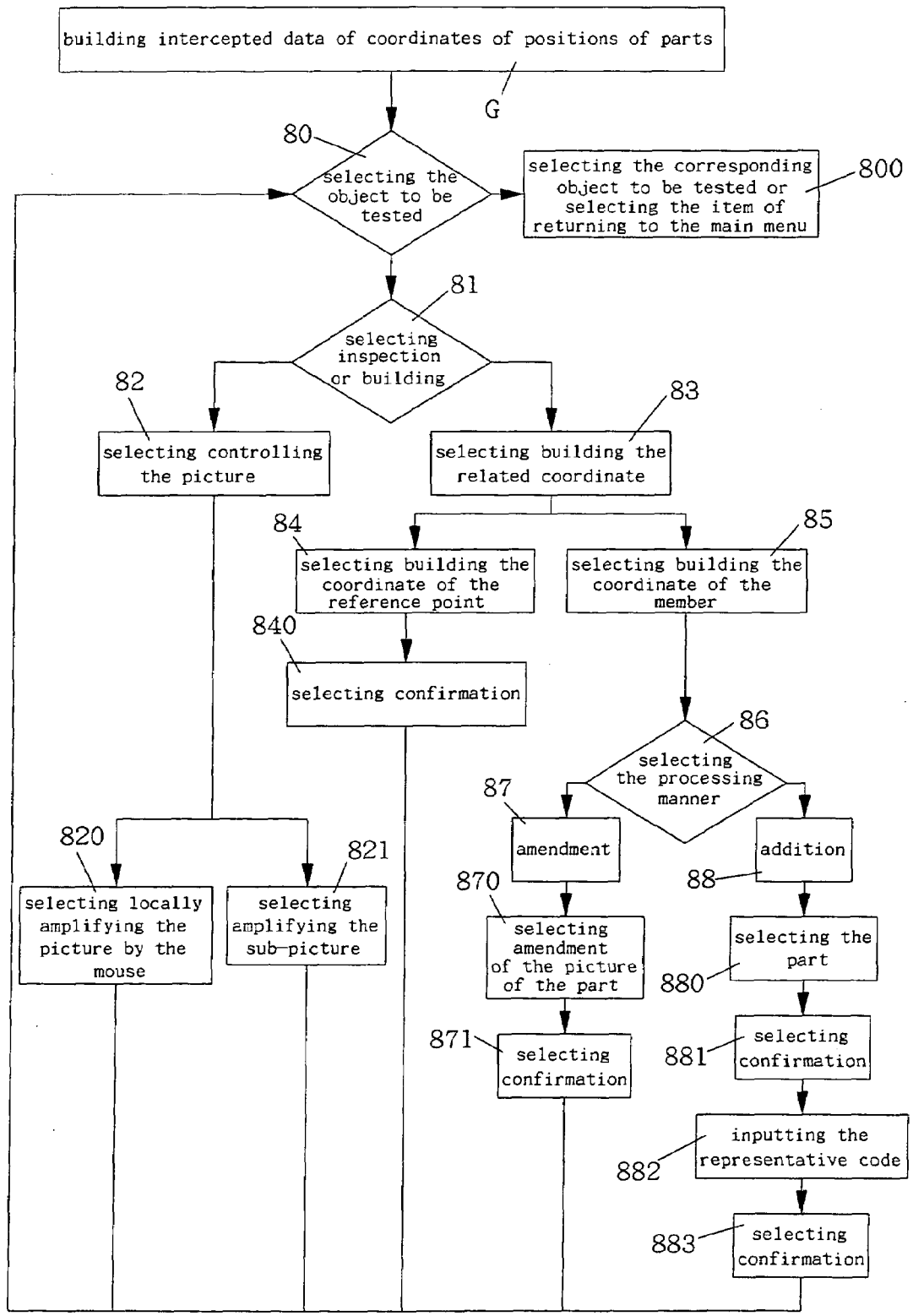
FIG. 12 is a flow chart of an item of building intercepted data of coordinates of positions of parts of the humanity interface development system of a testing program of a circuit board in accordance with the present invention.

Referring to FIG. 12, the item of building intercepted data of coordinates of positions of parts "G" includes the following steps:

Selecting the object to be tested 80: selecting the corresponding object to be tested, or selecting the item of returning to the main menu 800 to return to the destined location;

Selecting inspection or building 81: after selecting the object to be tested, then selecting the item of selecting inspecting the circuit board or building the data base, if selecting the item of inspecting the circuit board, then selecting controlling the picture 82 to directly amplify the inspection picture, if selecting the item of building the data base, then selecting building the related coordinate 83;

Selecting controlling the picture 82: selecting locally amplifying the picture by the mouse 820 or amplifying the sub-picture 821; if selecting locally amplifying the picture by the mouse 820, then moving the mouse to directly inspect the picture, if selecting amplifying the sub-picture 821, then forming a small-sized amplifying picture in the original picture;

Selecting building the related coordinate 83: selecting the mode of building the related coordinate for the reference point or member;

Selecting building the coordinate of the reference point 84: directly moving the cursor to select the position of the part, thereby forming a region that may produce the related coordinates, and then selecting confirmation 840;

Selecting building the coordinate of the member 85: building the coordinate of the member, such as the electronic part of the circuit board to be tested, including the following steps:

Selecting the processing manner 86: selecting the processing manner of amendment or addition;

Amendment 87: directly selecting amendment of the picture of the part 870, and then selecting confirmation 871;

Addition 88: selecting the part 880, then selecting confirmation 881, then inputting the representative code 882, and then selecting confirmation 883.

Thus, the procedure of building intercepted data of coordinates of positions of parts "G" may be accomplished conveniently, so that each of the parts of the circuit board may correspond to the data base of the system.

Referring to FIG. 1, the item of building relationships of items to failure rates of parts "H" includes the following steps: selecting the name of the object to be tested 730; then displaying the picture 731 so as to indicate the picture of the corresponding part; inputting the rate 732 to indicate the part corresponding to the item and the failure rate of the corresponding part, to facilitate the analysis work of the testing program.

Referring to FIG. 1, the item of linking and compiling files "I" includes the following steps: again selecting the name and picture of the object to be tested 740; after confirmation, then making the testing program by the compiling process 741, if not confirmed, returning to the main menu.

Accordingly, by means of co-operation of the above-mentioned flow charts, the designer may be guided by the complete scheme to change and operate the testing program by a humanity interface, thereby obtaining the programs that is rapid and convenient with little error and failure. In addition, the designer only needs to change the parameters or values, so that the change and maintenance of the entire program are rapid and exact.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A humanity interface development system of a testing program of a circuit board, comprising:
    a display of a main menu by which an operator selects one of multiple items with data pre-built therein, the main menu including: building configuration of objects to be tested, defining a footing of objects to be tested, using a program generator, building data of testing chapters, building documents and figure files of objects to be tested, building reference data, building coordinate data of positions of parts, building failure rate data corresponding to different parts, and linking and compiling files, building of data of each object to be tested co-operating with the program generator to produce the required program, and the items of building data of testing chapter and linking and compiling files co-operating with steps of building of data of each object to be tested, so that the operator conveniently uses data base and programs that are built according to existing orders of the system for testing a circuit board;
    the procedure of using a program generator includes the steps of:
        displaying a name of an object to be tested: displaying a name a object to be tested and data related thereto for identification of a designer;
        confirming: if the operator confirms the object to be tested, the following procedure is performed; if the operator does not confirm the object to be tested, the main menu is displayed;
        selecting the program manner: the operator respectively selects the modes of a program parameter, including testing, debug or limit; if the operator selects the testing mode, he inputs a testing parameter, if the operator selects the debug mode, he inputs a debug parameter, after the two items of inputting the testing parameter and inputting the debug parameter are input, the system respectively enters the designs of test program or debug program, and a flow chart button is displayed to prepare to proceed to a step of selecting a testing flow chart; if the operator selects the limit mode, selecting an item of a chapter or section to be amended is displayed, and selecting a testing manner to select a testing manner such as the function test or a debug test, and after selection to perform the step of selecting a testing number or selecting a testing number and debugging, then filling a limit value for each program or step, then selecting confirming the above steps and actions, if the above steps and actions are not confirmed, the main menu is displayed, if the above steps and actions are confirmed, the data in the data base is changed, and the step of displaying the name of the object to be tested is displayed;
    the procedure of selecting a testing flow chart includes: a process of file maintenance or reproduction, and selecting a button of a testing flow chart; and
    selecting the item of a testing flow chart is changed and designed according to different testing processes and manners, and a most complete process of selecting the item of a testing flow chart includes the following steps: setting power supply of the system, starting, a first pause, setting an exciting signal, a second pause, setting a measuring signal, a third pause, closing an exciting signal, a fourth pause, updating codes of a testing program, and updating codes of a debug program.

2. The humanity interface development system of a testing program of a circuit board in accordance with claim 1, wherein building configuration of objects to be tested includes the following steps:
    selecting a name of an object to be tested: displaying a name of an object to be selected from an existing data base of a display, choosing and identifying the name of the object;

displaying the data of the object to be tested: displaying original chosen records in the data base to facilitate judgment of following addition and amendment; and selecting processed items: selecting items of addition, deletion, amendment or returning to a previous page, wherein if the item of addition is chosen, the operator needs to input the data of the new board object to he tested, then store the data, and then return to the step of selecting the name of the object to be tested; if the item of deletion is chosen, the data of the object to be tested is deleted directly; if the item of amendment is chosen, the data of the object to be tested is amended, and is stored; if the item of returning to the previous page is chosen, the operator returns to the display of the main menu, whereby contents of each basic configuration of the objects to be tested is built.

3. The humanity interface development system of a testing program of a circuit board in accordance with claim 1, wherein defining a fooling of objects to be tested includes the allowing steps:

displaying a picture of a name of a selected object to be tested: displaying a picture of a name and related illustration of a selected object to be tested, to facilitate direct reference of an operator;

if it is a new object to be tested: judging if it is a new object to be tested, if it is a new object to be tested, the operator proceeds with the following settings, including:

selecting a clamping tool: selecting an existing common clamping tool or making a new clamping tool;

assigning a new number: defining a new number to a new board to facilitate identification; and inputting footing data: inputting data of each footing manually;

if it is not a new object to be tested, it means that the object to be tested is an electronic board that has generated a testing program, so that a database of the system directly displays a record for identification of the operator;

selecting a processing manner: the operator selects printing and selects the printing item to print data of each selected object for reference; if the operator selects ending, he needs to select the clamping tool, and has to select an existing common clamping tool or make a new clamping tool; if the operator selects the existing common clamping tool, the original footing data in the system is processed directly, to reproduce the cleared file of the footing to the respective data menu, and the procedure is then ended; if the operator selects to make a new clamping tool, the procedure is directly ended.

4. The humanity interface development system of a testing program of a circuit board in accordance with claim 1, wherein the step of setting power supply of the system includes the following steps: setting a flow chart of power supply: inputting values of voltage and current, then selecting a picture of a next output mode, such as outputting SS Check Box, then selecting confirming, if the above actions are confirmed, checking if a mode of the footing satisfies a standard mode of the footing, such as the mode of Form C Relay, then checking if the preset power supply of the footing is correct, if not, amending a footing definition and returning to the step of setting the flow chart of power supply to repeat the work; if the preset power supply of the footing is correct, storing the above data, and then returning to a display of selecting a testing flow chart.

5. The humanity interface development system of a testing program of a circuit board in accordance with claim 1, wherein the step of starting includes the following steps:

starting the flow chart: the system directly judging a parameter to directly enter a testing step or a debugging step, then inputting a content number, then judging if it is a new step or an old step, to respectively enter the step of definition of a new step or download of an old step, then judging if the parameter and the step are reproduced to the next chapter or section, if so, changing the parameter, then selecting confirming, if the above action is confirmed, storing the new parameter, if the above action is not confirmed, returning to a display of selecting a testing flow chart.

6. The humanity interface development system of a testing program of a circuit board in accordance with claim 1, wherein the step of the first pause, the second pause, the third pause, and the fourth pause respectively include the steps of: filling a hint message, and storing the hint message.

7. The humanity interface development system of a testing program of a circuit board in accordance wit claim 1, wherein the step of setting an exciting signal includes: selecting an exciting signal, then inputting values and conditions, then selecting confirmation, if the input values and conditions are confirmed, then storing the input values and conditions, if the input values and the conditions arc not confirmed, returning to a display of selecting a testing flow chart.

8. The humanity interface development system of a testing program of a circuit board in accordance with claim 1, wherein the step of setting a measuring signal includes a flow chart of setting a measuring signal which includes the following steps: directly selecting a measuring signal, then confirming if another instrument is used, when confirming another instrument is used, displaying a picture of the instrument and inputting values and conditions, when confirming no other instrument is used, directly inputting values and conditions, then selecting confirmation, if the input values and conditions are confirmed, storing the input values and conditions, if the input values and conditions are not confirmed, returning to a display of selecting a testing flow chart.

9. The humanity interface development system of a testing program of a circuit board in accordance with claim 1, wherein the step of closing an exciting signal includes a flow chart of closing an exciting signal which includes the following steps: selecting an exciting signal to be closed, then selecting confirmation, if the selection is confirmed, storing changed results, if the selection is not confirmed, returning to a display of selecting a testing flow chart.

10. The humanity interface development system of a testing program of a circuit board in accordance with claim 1, wherein the step of updating codes of a testing program, and updating codes of a debug program include the following steps: judging if a column is blank, if the column is blank, directly displaying a hint, if the column is not blank, ten capturing program codes.

11. The humanity interface development system of a testing program of a circuit board in accordance with claim 1, wherein the process of file maintenance or reproduction includes the following steps:

selecting file maintenance or reproduction: selecting the process of file maintenance or reproduction, if the process of file maintenance is selected, it is necessary to select a manner of file maintenance, if the process of reproduction is selected, it is necessary to select a maimer of reproduction; wherein, if the operator selects the manner of file maintenance, it includes the following steps:

selecting a class of a program code: selecting a testing parameter or a debugging parameter, then returning to a display of selecting a testing flow chart, to respectively perform a design of a testing program or a debugging program;

selecting amending a program code: selecting a content of amendment for testing or debugging, so as to select a number of a primary and a secondary testing or debugging step, and to make sure a content of the testing program, and selecting a manner of amendment for different program codes, so as to select a deletion, insertion or cancel working process, then selecting confirmation, if selecting the cancel working process, then directly returning to a display of selecting a testing flow chart, if selecting the deletion working process or insertion working process, then amending the content of the data base, and then returning to the step of selecting a manner of amendment for different program codes;

selecting returning to a display of a program generator or returning to the display of the main menu, then returning to an assigned position;

if the operator selects a manner of reproduction, it includes the steps of selecting three modes of reproduction, including: a testing program being reproduced mutually, a testing program being reproduced to the debugging programs, and the debugging programs being reproduced mutually, after selection, filling the reproduced content then selecting confirmation, if not confirmed, then returning to a display of selecting a testing flow chart, if confirmed, then copying the reproduced content and returning to a display of filling the reproduced content to repeat the steps therefrom.

12. The humanity interface development system of a testing program of a circuit board in accordance with claim 1, wherein a procedure of building data of testing chapters includes the following steps: selecting an object to be tested; then displaying testing contents to indicate the number and name of the testing contents of each chapter or section, and then inputting a representative code into the content of the display to facilitate classification.

13. The humanity interface development system of a testing program of a circuit board in accordance with claim 1, wherein a procedure of building documents and figure files of objects to be tested includes the following steps: preparing a hint of documents and figure files, so that when a designer selects the building documents and figure files of objects to be tested from the main menu, the related hints are immediately displayed, to remind the designer to prepare the related documents and figure files for input, and then the designer makes sure of building the documents and figure files of objects to be tested.

14. The humanity interface development system of a testing program of a circuit board in accordance with claim 1, wherein a procedure of building reference data includes the following steps: selecting a new board or an old board, if selecting the new board, then building data of practical figures and images and data of respective positions of parts according to an instruction, so as to input figure file data of files of the practical figures and images and files of the positions of the parts, and placing them in an assigned menu, if selecting the old board, then directly selecting data on the figure files using a cursor, and then displaying the figure files for confirmation of a designer.

15. The humanity interface development system of a testing program of a circuit board in accordance with claim 1, wherein a procedure of building coordinate data of positions of parts includes the following steps:

selecting an object to be tested: selecting a corresponding object to be tested, or selecting to return to the main menu to return to an assigned location;

selecting inspection or building: after selecting the object to be tested, then selecting inspecting the circuit board or building the data base, if selecting inspecting the circuit board, ten selecting controlling the display to enlarge an inspection picture, if selecting building the data base, then selecting building a related coordinate;

selecting controlling the display: selecting locally enlarging the inspection picture using a mouse or enlarging a portion thereof; if selecting locally enlarging the inspection picture by the mouse, then moving the mouse to directly inspect the inspection picture, if selecting enlarging a portion of the inspection picture, then forming a small-sized enlarged inspection picture in the display;

selecting building a related coordinate: selecting a mode of building a related coordinate for a reference point or member;

selecting building a coordinate of the reference point: directly moving the cursor to select a position of a part, thereby forming a region that produces related coordinates, and then selecting confirmation;

selecting building a coordinate of a member: building coordinate of a member, such as an electronic part of the circuit board to be tested, including the allowing steps:

selecting a processing manner: selecting a processing manner of amendment or addition;

amendment: directly selecting amendment of a picture of a part, and then selecting confirmation;

addition: selecting a part, then selecting confirmation, then inputting a representative code, and then selecting confirmation, whereby the procedure of building intercepted data of coordinates of positions of parts is accomplished, so that each of the parts of the circuit board correspond to a database of the system.

16. The humanity interface development system of a testing program of a circuit board in accordance with claim 1, wherein a procedure of linking and compiling files includes the following steps: selecting the name and picture of an object to be tested; alter confirmation, then making the testing program by a compiling process, if not confirmed, returning to the main menu.

17. A humanity interface development system of a testing program of a circuit board, comprising:

a display of a main menu by which an operator selects one of multiple items with data pre-built therein, the main menu including:

building configuration of objects to be tested, defining footing of objects to be tested, using a program generator, building data of testing chapters, building documents and figure files of objects to be tested, building reference data, building coordinate data of positions of parts, building failure rates corresponding to different parts, and linking and compiling files, building of data of each object to be tested co-operating with the program generator to produce the required program, and the items of building data of testing chapters and linking and compiling files co-operating with steps of building of data of each object to be tested, so that the operator may conveniently use data base and programs that are built according to existing orders of the system for testing a circuit board, the procedure of building failure rate data corresponding to different parts includes the following steps: selecting a name of an object to be tested; then displaying a picture of a corresponding part; inputting a failure rate of the corresponding part to facilitate analysis work of the testing; and the procedure of using a program generator includes the steps of:

displaying a name of an object to be tested; displaying a name a object to be tested and data related thereto for identification of a designer;

confirming: if the operator confirms the object to be tested, the following procedure is performed if the operator does not confirm the object to be tested, the main menu is displayed;

selecting the program manner: the operator respectively selects the modes of a program parameter, including testing, debug or limit; if the operator selects the testing mode, he inputs a testing parameter, if the operator selects the debug mode, he inputs a debug parameter, after the two items of inputting the testing parameter and inputting the debug parameter are input, the system respectively enters the designs of test program or debug program, and a flow chart button is displayed to prepare to proceed to a step of selecting a testing flow chart; if the operator selects the limit mode, selecting an item of a chanter or section to be amended is displayed, and selecting a testing manner to select a testing manner such as the function test or a debug test, and after selection to perform the step of selecting a testing number or selecting a testing number and debugging, then filling a limit value for each program or step, then selecting confirming the above steps and actions, if the above steps and actions are not confirmed, the main menu is displayed, if the above steps and actions are confirmed, the data in the data base is changed, and the step of displaying the name of the object to be tested is displayed;

the procedure of selecting a testing flow chart includes: a process of file maintenance or reproduction, and selecting a button of a testing flow chart; and selecting the item of a testing flow chart is changed and designed according to different testing processes and manners, and the most complete process of selecting the item of a testing flow chart includes the following steps:

setting a power supply of the system, starting a first pause, setting an exciting signal, a second pause, setting a measuring signal, a third pause, closing an exciting signal, a fourth pause, updating codes of a testing program, and updating codes of a debug program.

* * * * *